United States Patent [19]
Takada et al.

[11] Patent Number: 6,018,123
[45] Date of Patent: Jan. 25, 2000

[54] HEAT COLLECTOR WITH SOLAR CELL AND PASSIVE SOLAR APPARATUS

[75] Inventors: Takeshi Takada, Kyoto; Kimitoshi Fukae; Toshihiko Mimura, both of Nara; Masahiro Mori; Satoru Shiomi, both of Kyoto, all of Japan

[73] Assignee: Canon Kabushiki Kaisha, Tokyo, Japan

[21] Appl. No.: 08/774,011

[22] Filed: Dec. 26, 1996

[30] Foreign Application Priority Data

Jan. 31, 1996 [JP] Japan .................................. 8-035755
Feb. 16, 1996 [JP] Japan .................................. 8-052568

[51] Int. Cl.⁷ .................................................. H01L 31/04
[52] U.S. Cl. .......................................................... 136/248
[58] Field of Search ..................................... 136/248, 251, 136/291

[56] References Cited

U.S. PATENT DOCUMENTS

| | | | |
|---|---|---|---|
| 4,056,405 | 11/1977 | Varadi ..................... | 136/248 |
| 4,080,221 | 3/1978 | Manelas ................... | 136/248 |
| 4,095,997 | 6/1978 | Griffiths .................. | 136/89 |
| 4,137,097 | 1/1979 | Kelly ...................... | 136/89 |
| 4,186,033 | 1/1980 | Boling et al. ............. | 136/248 |
| 4,587,376 | 5/1986 | Kosaka .................... | 136/248 |
| 5,589,006 | 12/1996 | Itoyama et al. ........... | 136/248 |

FOREIGN PATENT DOCUMENTS

| | | |
|---|---|---|
| 34 19 797 | 11/1985 | Germany . |
| 4343481 | 11/1992 | Japan .......................... H01L 31/042 |
| 7280358 | 10/1995 | Japan .......................... F24J 2/04 |
| 2 214 710 | 9/1989 | United Kingdom . |

OTHER PUBLICATIONS

Patent Abstracts of Japan, vol. 015, No. 513 (M–1196), Dec. 26, 1991 (corresponding to JP 03–225159).

Patent Abstracts of Japan, vol. 016, No. 079 (E–1171), Feb. 26, 1992 (corresponding to JP 03–266477).

Patent Abstracts of Japan, vol. 096, No. 002, Feb. 29, 1996 (corresponding to JP 07–280359).

*Primary Examiner*—John Goodrow
*Attorney, Agent, or Firm*—Fitzpatrick, Cella, Harper & Scinto

[57] ABSTRACT

A solar cell module is provided at the position of a heat collecting plate inside a heat collector, at the position of its window member or at the position of its bottom plate. With such constitution, a hybrid system can be achieved in which the hot air can be led into a house while maintaining the performance of solar cells making use of amorphous silicon semiconductors.

In the case where solar cells are provided at the position of the heat collecting plate, a resin used as a filler has so high a thermal resistance that the heat conduction to the air may be insufficient to make it impossible to obtain hot air having a sufficiently high temperature. To solve this problem, the solar cell module is made to have a smaller thermal resistance on the non-light-receiving side than the thermal resistance on the light-receiving side.

66 Claims, 8 Drawing Sheets

HEAT COLLECTOR WITH SOLAR CELL AND PASSIVE SOLAR APPARATUS

BACKGROUND OF THE INVENTION

1. Field of the invention

This invention relates to a combined apparatus comprised of a passive solar apparatus and a solar cell, used in housing.

2. Related Background Art

1. Passive Solar Apparatus

Japanese Patent Publication No. 07-280358 discloses a passive solar apparatus for effectively utilizing solar heat in cold districts.

A house employing the above passive solar apparatus will be described with reference to FIGS. 1 and 2. FIG. 1 schematically illustrates its whole construction. FIG. 2 is a detailed view of a heat collector.

The air entering from an open air inlet 105 provided at the eaves slowly flows toward the ridge through an air flow path 103 formed between shingles 101 and a heat insulating material 102. In that course, the air becomes hot while being heated by the shingles 101 having become hot because of sunshine. In order to make the air in the air flow path 103 hotter, a heat collector 104 is provided in the vicinity of the ridge. The air coming up through the air flow path 103 right beneath the roof flows into this heat collector 104.

As shown in FIG. 2, the heat collector 104 is so made up that the sunshine heat received by a heat collecting plate 115 is enclosed in a glass box 117 so as not to dissipate to the outside. The air taken into from an inlet 116 it becomes hotter while being heated by the heat collecting plate 115 to become hot air of 80° C. or above. Since the heat collecting plate 115 is covered with glass, the heat collecting plate 115 does not cool if the wind blows when heated by sunshine.

The non-light-receiving side of the heat collecting plate 115 is utilized as the air flow path 103 inside the heat collector 104. This is because the non-light-receiving side formed of an heat insulating material has a smaller heat loss when the heat loss to the outside from the glass on the light-receiving side is compared with that from the heat insulating material forming a box bottom plate on the non-light-receiving side.

The air heated to 80° C. or above in the heat collector 104 through the air flow path 103 provided beneath the shingles 101 is brought into the house by means of a fan 107, and is passed through a duct 106 to come under the floor, where the heat is accumulated in concrete covered with a heat insulating material 110 so that the heat can be taken through outlets 109 and utilized as desired.

The fan may also be rotated in reverse so that the heat under the floor can be dissipated outside.

2. Solar Cell Module Combined with Shingle

Japanese Patent Application Laid-open No. 04-343481 discloses a solar cell module formed of a solar cell element, a filler and a surface protective film which are laminated to a metal plate in order. This can be used as a shingle integral type solar cell.

As solar cell elements, amorphous silicon semiconductors are preferably used. This is because the amorphous silicon semiconductors have less temperature dependence than crystal silicon semiconductors, and hence, not only they may cause less deterioration of characteristics in an environment of high temperature but also their use at high temperatures of 80° C. or above can prevent the Stebler-Ronskie deterioration inherent in the amorphous silicon semiconductors. Thus, the amorphous silicon semiconductors are preferable for use in the shingle type solar cell.

In cold districts, however, such temperatures can not be maintained and the advantages of amorphous silicon solar cells can not be enjoyed.

In addition, in such cold districts, snow may fall on solar cell modules and shade them to cause the problem that the system does not work.

SUMMARY OF THE INVENTION

The above problems on solar cells in cold districts can be solved by providing a solar cell module at the position of the heat collecting plate, at the position of a window member or at the position of a bottom plate inside the heat collector previously described.

More specifically, the present invention provides a heat collector comprising a box having a window through which sunlight can enter; the box being provided with an inlet through which a fluid heating medium is flowed into the box, an outlet through which the heating medium is flowed out, and a heat collecting plate, and a solar cell being provided in the box.

In the case where solar cell is provided at the position of the heat collecting plate, a resin used as a filler has so high a thermal resistance that the heat conduction to the air may be insufficient to make it impossible to obtain hot air having a sufficiently high temperature. To solve this problem, the solar cell module may be made to have a smaller thermal resistance on the non-light-receiving side (the back side resistance) than the thermal resistance on the light-receiving side (the top side resistance).

With such constitution, a hybrid system can be achieved in which the warm air can be led into the room while maintaining the performance of solar cells making use of amorphous silicon semiconductors.

Even when snow lies on the heat collector, the fan of the heat collection system may be rotated in reverse to make the hot air flow backward, whereby the heat collecting plate can be warmed to melt snow by utilizing the heat accumulated in the concrete under the floor, so that the solar cell in the heat collector can receive sunshine and at the same time the performance of the solar cell can be prevented from lowering.

DESCRIPTION OF THE PREFERRED EMBODIMENTS

Figure 1:
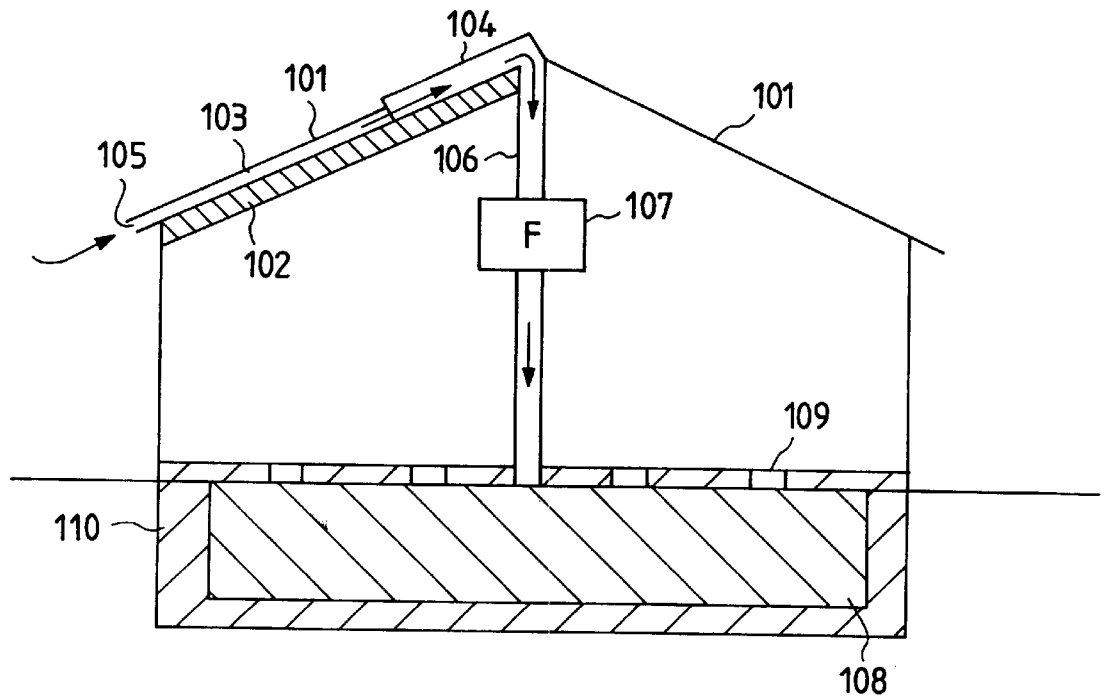
FIG. 1 illustrates a conventional passive solar apparatus.
Figure 2:
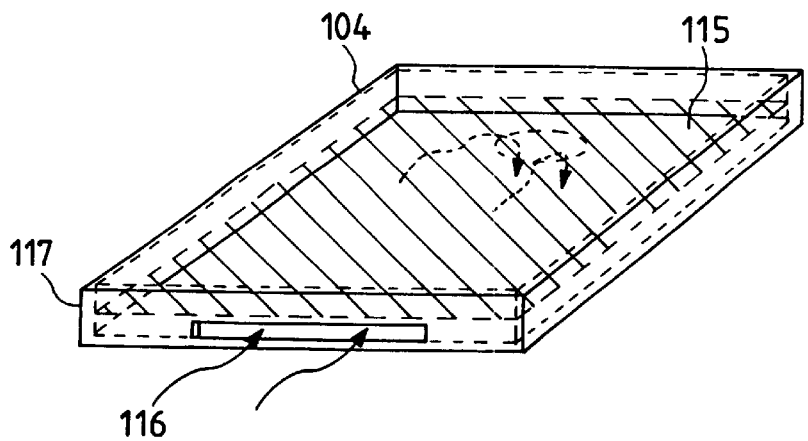
FIG. 2 illustrates a heat collector of the conventional passive solar apparatus.
Figure 3:
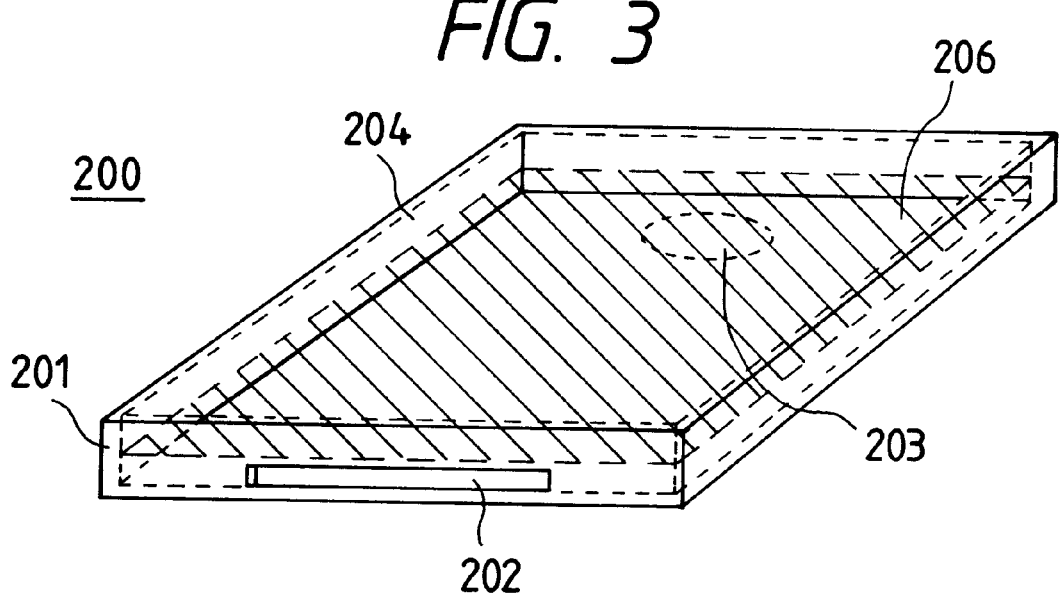
FIG. 3 is a perspective view of a heat collector of the present invention (an embodiment where the solar cell is provided in or as a heat collecting plate).
Figure 4:
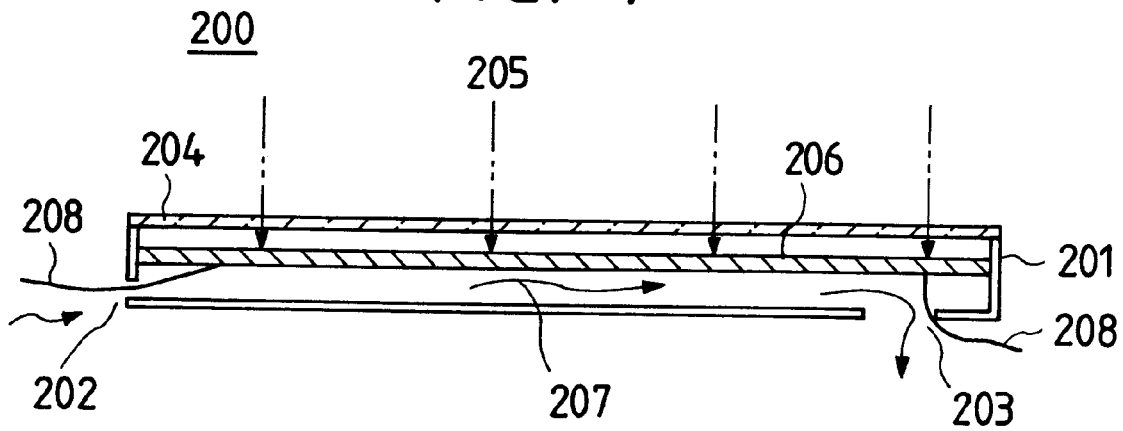
FIG. 4 is a cross-sectional view of the heat collector of the present invention, shown in FIG. 3.

FIG. 3 perspectively illustrates a heat collector 200 according to an embodiment of the present invention in which a solar cell module serves as a heat source (a heat collecting plate). FIG. 4 is a cross-sectional view thereof. A box 201 is provided with an inlet 202 and an outlet 203 through the both of which air can pass. One side of the box 201 forms a window 204 so that sunlight 205 can enter through it. A solar cell module 206 is so provided as to be exposed to the incident light and divide the space in the heat collector into upper and lower two parts. The solar cell module 206 absorbs the sunlight 205 to generate heat, and transmits a certain amount of heat to air 207 on the non-light-receiving side of the heat collector. The air 207 entering from the inlet 202 is heated by the solar cell module to turn to hot air, and flows out through the outlet 203. In this heat collector, the air on the light-receiving side is not utilized as a heating medium, because the heat dissipates through the glass window on the light-receiving side and the air can not become well hot.

Electricity generated in the solar cell module is taken out on the non-light-receiving side of the solar cell module 206 so as to be led out to the outside through a cable connector 208 or the like.

Figure 5:
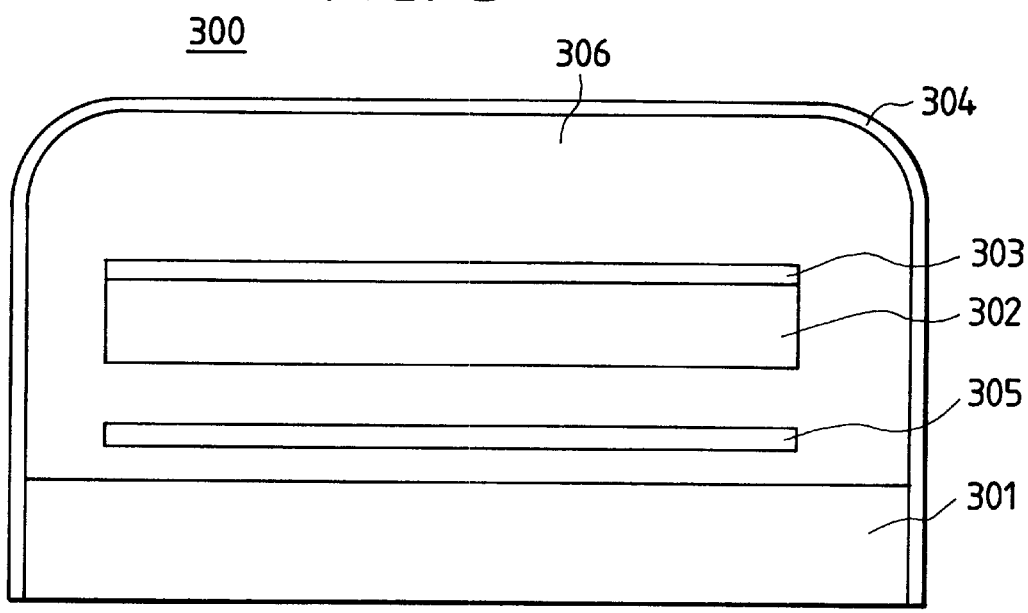
FIG. 5 illustrates a solar cell module integrally formed as a heat collecting plate of the heat collector according to the present invention.

FIG. 5 cross-sectionally illustrates the solar cell module used in the heat collector of the present invention. A solar cell module 300 is comprised of a back reinforcing member 301, a solar cell 302, a protective film 303, a surface covering material 304, a back covering film 305 and a filler 306. A take-out electrode terminal is also appropriately provided.

The solar cell module used in the present invention is required to have a smaller thermal resistance on the non-light-receiving side than the thermal resistance on the light-receiving side. Stated specifically, this is achieved by making smaller the thickness of the filler on the back side of the solar cell module than the thickness thereof on the top side. This is based on a finding as explained below.

The mount Q of heat dissipation from a body having a higher temperature $\Delta t$ than its environment is commonly represented as $Q=\Delta t/R$, where R is thermal resistance of the body. In order to make heat dissipation Qb to the back of the solar cell larger than heat dissipation Qs to the top side (the light-receiving side), thermal resistance Rb on the back side (the non-light-receiving side) of the solar cell module may be made smaller than thermal resistance Rs on the top side (the light-receiving side).

In order to improve the efficiency of heat dissipation to the back, the surface of the back reinforcing member 301 may be roughened or may be provided with a fin.

In order to decrease thermal radiation resistance, the surface of the back reinforcing member (plate) may preferably be blackened.

The heat collector may preferably be provided with a heat insulation material on the wall surface in its interior.

If the solar cell module is heated in excess, there may be an adverse effect such that wiring members become damaged. Hence, the solar cell module may be provided only in the vicinity of the air inlet.

The position of the solar cell module in the heat collector is not limited to the one described above. Examples will be described below in which the solar cell module is provided to a window member of the heat collector and in which the solar cell module is provided to a bottom plate of the heat collector.

Solar Cell Module Provided to Window

Figure 6:
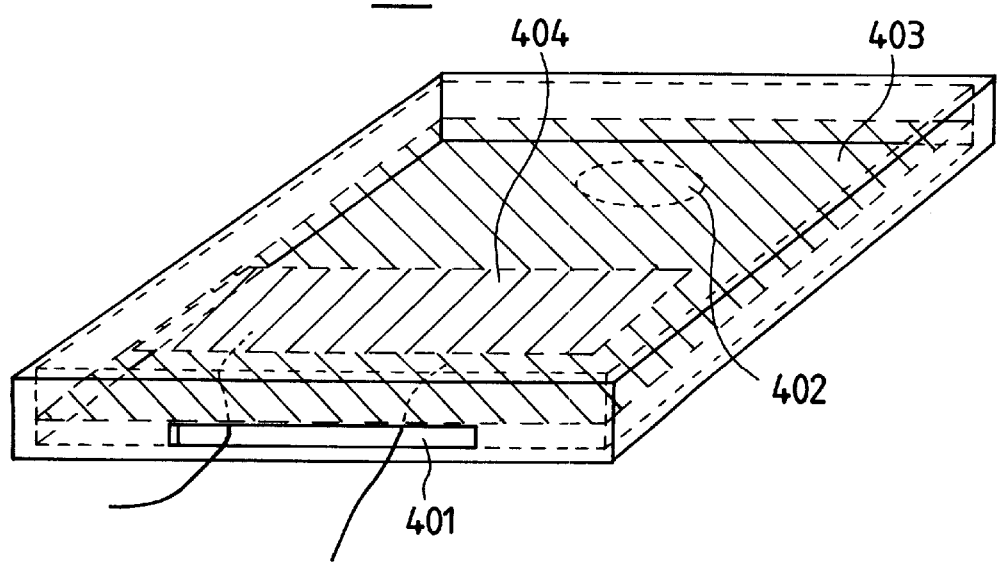
FIG. 6 is a perspective view of another heat collector of the present invention (an embodiment where the solar cell is provided to a window member).
Figure 7:
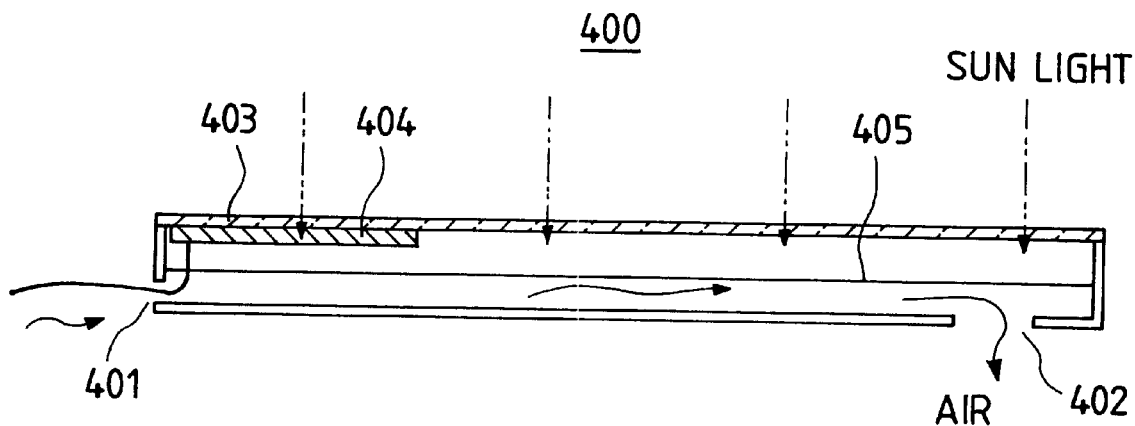
FIG. 7 is a cross-sectional view of the heat collector of the present invention, shown in FIG. 6.

FIGS. 6 and 7 are a perspective view and a cross-sectional view, respectively, of a heat collector 400 according to the present invention, having a window with the solar cell. The heat collector 400 has an air inlet 401 and an air outlet 402 and its top is formed of a transparent window plate 403 made of glass or acrylic resin. A solar cell 404 is disposed to part of the window plate. In this instance, the solar cell 404 is used in the form the module as illustrated in FIG. 5.

Like the embodiment where the solar cell is formed in the heat collecting plate, the solar cell module in the present embodiment is sealed on the glass plate by the use of a resin. In this instance, a reinforcing plate is on the light-receiving side and hence the solar cell module is comprised of a reinforcing member made of glass or a transparent resin, a top-side filler, a solar cell, a back-side filler and a protective film which are laminated in order.

In this embodiment, the solar cell module may preferably have a smaller thermal resistance on the non-light-receiving side than the thermal resistance on the light-receiving side. Stated specifically, this is achieved by making smaller the thickness of the filler on the back side of the solar cell module than the thickness thereof on the top side.

The solar cell module is integrally formed in the window member as described above. Alternatively, it may be stuck thereto with an adhesive or a pressure-sensitive adhesive double-coated tape. As another method, the solar cell module may be directly formed on a transparent substrate by CVD.

A heat collecting plate 405 comprised of a metal plate is also provided, and the air passes on the back of the heat collecting plate while being heated. The heat collector may be provided with a heat insulation material on the wall surface in its interior.

Solar Cell Module Provided to Bottom Plate

Figure 8:
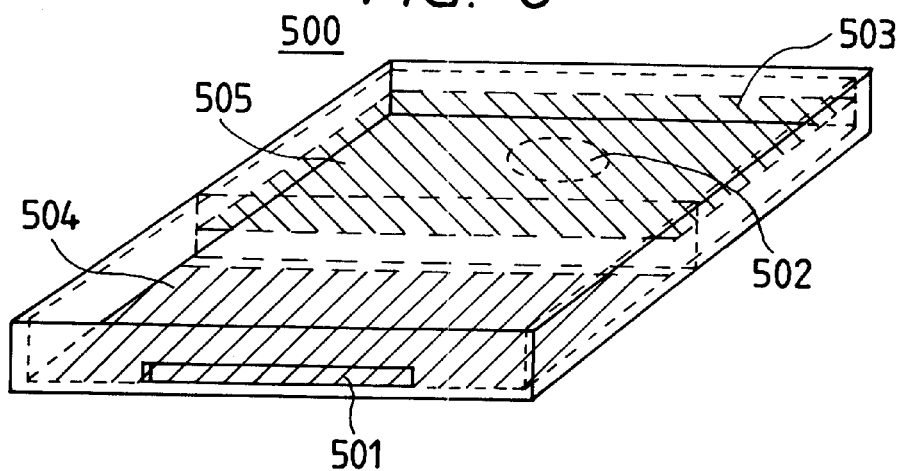
FIG. 8 is a perspective view of still another heat collector according to the present invention (an embodiment where the solar cell is provided to a bottom plate).
Figure 9:
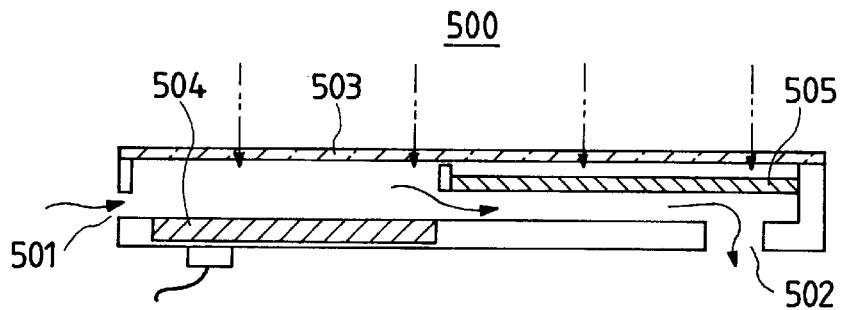
FIG. 9 is a cross-sectional view of the heat collector of the present invention, shown in FIG. 8.

FIGS. 8 and 9 are a perspective view and a cross-sectional view, respectively, of a heat collector 500 according to the present invention, having the solar cell in a bottom plate. The heat collector 500 has an air inlet 501 and an air outlet 502 and its top is formed of a transparent window plate 503 made of glass or acrylic resin. A solar cell 504 is disposed to part of the bottom plate. In this instance, the solar cell 504 is used in the form the module as illustrated in FIG. 5, which may be stuck to the bottom plate with an adhesive or a pressure-sensitive adhesive double-coated tape. Alternatively, the solar cell module may be integrally formed with the bottom plate as shown in FIG. 10.

Figure 10:
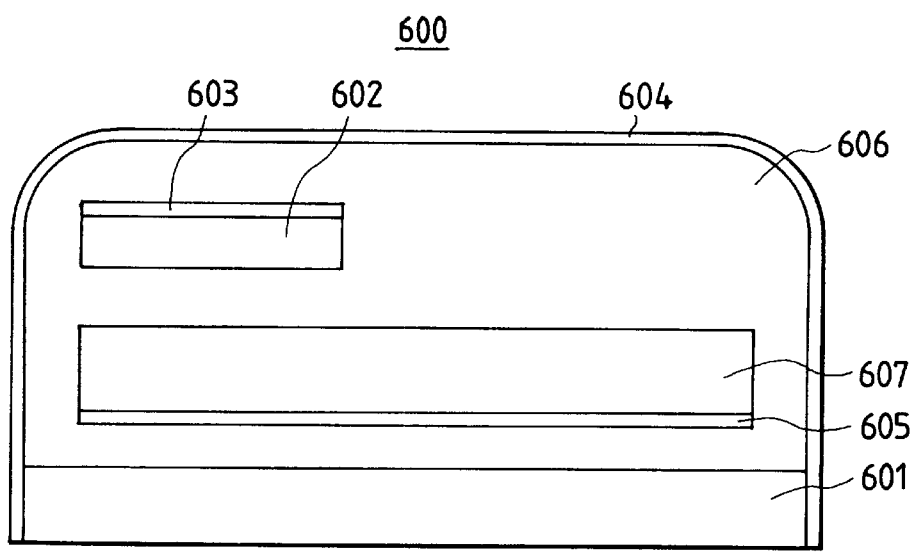
FIG. 10 illustrates a solar cell module integrally formed in the bottom plate of the heat collector according to the present invention.

FIG. 10 cross-sectionally illustrates a bottom plate member 600 in which the solar cell is integrally formed. The bottom plate member 600 is comprised of a back reinforcing member 601, a solar cell 602, a protective film 603, a surface covering film 604, a back covering film 605 and a filler 606.

A take-out electrode terminal is also appropriately provided. The solar cell 602 is provided to part of the back reinforcing member 601, and is sealed with the filler 606. A heat insulating material 607 is also provided in order to prevent the heat from being let away through the bottom of the heat collector.

In the constitution where the solar cell is disposed to the bottom plate, the heat can be collected in a good efficiency and also the performance of the solar cell can be maintained.

The components constituting the heat collector of the present invention will be described in greater detail with reference to FIGS. 3 and 4.

Box

The box 201 may preferably be made of a material having high heat insulation properties. For example, wood, polystyrene, calcium silicate, foamed styrol or the like may be used as the material. The box has an airtight structure.

Inlet

At least one inlet 202 is provided in the box, and is so formed that the air or water can be flowed into the box therethrough. A filter for preventing dust or the like from entering or a chemical filter for blocking air containing acidic substances may also be provided.

A throttle may also be provided so that the flow rate of air can be controlled.

Outlet

At least one outlet 203 is provided in the box, and is so formed that the air or water can be flowed out of the box therethrough. A filter for preventing dust or the like from entering or a chemical filter for blocking air containing acidic substances may also be provided.

A throttle may also be provided so that the flow rate of air can be controlled.

In some instances, a thermostat may be further provided so that the temperature of the air sent into the house can be controlled.

Window

The window 204 may preferably be made of a material having high light transmission properties and heat insulation properties. For example, glass, polycarbonate, polyethylene terephthalate, acrylic resin, nylon or the like may be used as the material. The window may be attached to the box by the use of a rubber adhesive, a silicone adhesive or an acrylic adhesive. An etch cover may also be optionally provided.

Heat Collecting Plate

The heat collecting plate 206 is, as previously described, comprised of the solar cell module 300 shown in FIG. 5, which comprises a metal plate and the solar cell sealed thereon with a resin. The respective components thereof will be described below.

1) Back Reinforcing Member (Back Plate)

The back reinforcing member 301 may be made of a material including metal plates of various types, in particular, insulation-treated metals such as coated zinc steel sheet, as well as carbon fiber, FRP (glass fiber reinforced plastics), ceramics, and glass.

2) Solar Cell (Photovoltaic Cell)

As the solar cell 302, an amorphous silicon solar cell may preferably be used, as having good characteristics at a high temperature. It may be constituted as shown in FIG. 11 as an example.

Figure 11:
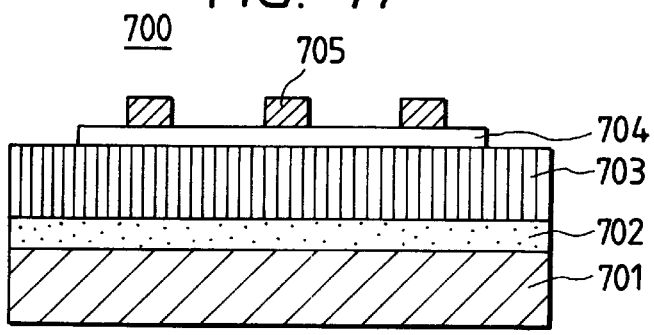
FIG. 11 illustrates an example of the solar cell used in the heat collector of the present invention.

As shown in FIG. 11, a solar cell 700 is constituted of a conductive substrate 701, a back reflective layer 702, a semiconductor layer 703, a transparent conductive layer 704 and a collector electrode 705.

The conductive substrate 701 may include a stainless steel sheet, an aluminum sheet, a copper sheet, a titanium sheet, a carbon sheet, zinc-plated steel sheet, films of resins a surface of which a conductive layer is formed on such as polyimide, polyester, polyethylene napthalide and epoxy resins, and ceramic sheets such as a glass sheet.

As the back reflective layer 702, a metal layer, a metal oxide layer or a composite layer of a metal layer with a metal oxide layer may be used. As metal materials, titanium, chromium, molybdenum, tungsten, aluminum, silver, copper, nickel and the like may be used. As metal oxide materials, zinc oxide, titanium oxide, tin oxide and the like may be used. Such metal layer and metal oxide layer may be formed by a process including resistance heat vacuum deposition, electron beam vacuum deposition, and sputtering.

The semiconductor layer 703 may have a pin structure formed by plasma-assisted CVD using a-Si, a-SiGe or a-Sic. It may have the pin structure in plurality.

To form the transparent conductive layer 704, the metal oxide as described above may be used.

The collector electrode 705 may be formed by masked screen printing using a conductive paste, or fixing a metal wire such as copper wire using a conductive paste such as carbon paste.

3) Protective Film

The protective film 303 in the solar cell module shown in FIG. 5 protects the surface of the solar cell and has the role of improving the yield in the step of fabricating a plurality of solar cells. As materials therefor, resins such as acrylic silicone resin, acrylic resin and silicone resin incorporated with inorganic fine particles may be used.

4) Surface Covering Material

The surface covering material 304 may be formed of glass, or a film of a resin including fluorine resins such as polyethylene-tetrafluoroethylene, polyethylene trifluoride and polyvinyl fluoride. Glass and fluorine resin films usually have a poor adhesion, and hence their back adherent surfaces may be subjected to corona treatment or primer coating.

5) Back Covering Film

The back covering film 305 is necessary for ensuring the insulation between the solar cell and the back reinforcing member, and is required to have insulating properties. Materials therefor include nylon and polyethylene terephthalate. The back covering film may be formed by coating an insulating material on the back reinforcing member 301.

6) Filler

As materials for the filler 306, resins such as EVA (ethylene-vinyl acetate copolymer), EEA (ethylene-ethyl acrylate), butyral resin, silicone resin and epoxy resin may be used. The filler may have a glass nonwoven fabric sheet in order to improve scratch resistance. It may also contain an ultraviolet light absorber that absorbs ultraviolet rays.

The above constitution of the solar cell integrated heat collector also applies to either case of the window member integral type or the bottom plate integral type.

EXAMPLES

The present invention will be described below in greater detail by giving Examples. The present invention is by no means limited to these Examples.

Example 1

The heat collector as shown in FIGS. 3 and 4 was produced in the following way.

First, the solar cell as shown in FIG. 11 was prepared. On a continuous stainless steel substrate, an Al layer containing 1% of Si and a ZnO layer were successively formed by sputtering. Next, an a-Si (amorphous silicon) semiconductor layer having two pin structures was formed by plasma-assisted CVD. Finally, as a transparent conductive layer, an $In_2O_3$ thin layer was formed by vacuum-depositing In by resistance heating in an atmosphere of $O_2$.

Next, the continuous substrate with photovoltaic components thus obtained was cut in a size of 300 mm long×80 mm wide, followed by short-circuit elimination.

A polymer type silver-plated copper paste was further patternwise printed thereon by means of a screen printer, followed by heating and drying to form a collector electrode.

Next, a tin-plated copper wire was connected as a bus bar to the collector electrode. On the back of the stainless steel substrate, copper foil was spot-welded as a back-side electrode.

A plurality of solar cells prepared in this way were connected to obtain a solar cell having a size of 300 mm long and 1,052 mm wide.

The solar cell thus obtained was formed into the module as shown in FIG. 5 in the following way.

First, a protective film 303 comprised of acrylsilicone resin was formed on the surface of the solar cell 302.

Next, as the back reinforcing member 301, a zinc-plated steel sheet was made ready for use. A zinc-coated steel sheet was used which was coated with a dark-color coating material on its light-receiving side, having a heat conductivity of 38 kcal/mh° C. and having a thickness of 400 μm. This steel sheet was cut in a size of 850 mm×1,400 mm. With regard to the thickness, the thickness of 400 μm was that of a zinc-plated steel sheet usually used as a roof material, which was used as it was. (Since it is disposed inside the heat collector, it need not have so much strength, load resistance and so forth, and a steel sheet having a much smaller thickness may be used).

The steel sheet coated with a dark-color coating material on its light-receiving side was used in order to improve heat radiation to the back side of the solar cell module.

A hole through which positive and negative terminals led from the solar cell are taken out was previously made at a suitable position of the back reinforcing member 301.

Next, to the back reinforcing member 301, a PET (polyethylene terephthalate) film was laminated as the back covering film 305. The film used was in a thickness of 100 μm. Then, to the back covering film 305, a sheet-like EVA (ethylene-vinyl acetate copolymer; weatherable grade) was laminated as the filler 306, which was formed in a thickness of 230 μm.

Then the solar cell 302 covered with the protective film 303 was further laminated thereto, and EVA (ethylene-vinyl acetate copolymer; weatherable grade) was further laminated to the solar cell 302 as the filler 306 via the protective film 303, which filler was formed in a thickness of 460 μm.

Finally, as the surface covering material 304, glass was laminated to the filler 306. The surface covering material 304 was previously subjected to plasma treatment on the adherend surface in order to improve its adhesion to the EVA layer, and was in a thickness of 4 mm.

The integral laminate obtained was pressed and deaerated using a vacuum laminator, during which the filler was caused to melt at 150° C. to effect mutual adhesion between resin layers. Thus, a solar cell module was produced.

Cable connectors and so forth were further soldered to take out the positive and negative terminals from the terminal take-out hole previously made in the back reinforcing member, and were connected to a terminal box.

Figure 12:
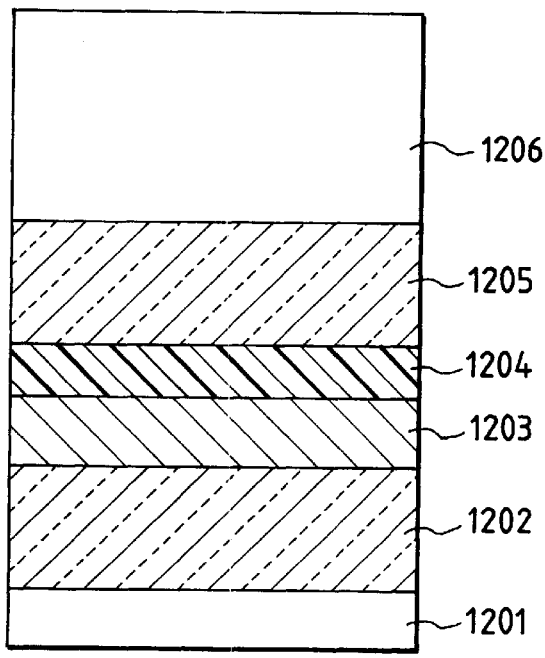
FIG. 12 shows the constitution of Example 1.

Data concerning thermal conduction resistance (thermal resistance) on the light-receiving side and non-light-receiving side of the solar cell module of Example 1 described above are shown in Table 1, and its corresponding constitution is shown in FIG. 12.

In FIG. 12, reference numeral 1201 denotes the back covering film; 1202, the filler on the back side; 1203, the solar cell; 1204, the protective film; 1205, the filler on the top side; and 1206, the surface covering material.

As shown in Table 1, the thermal conduction resistance on the light-receiving side is higher than 3,000 $m^2h°$ C./cal, whereas the thermal conduction resistance on the non-light-receiving side is 1.46 $m^2h°$ C./cal, and the ratio of the thermal conduction resistance on the light-receiving side to the thermal conduction resistance on the non-light-receiving side is about 2,500. Thus, as is seen therefrom, the heat from the solar cell is well transmitted to the back.

A heat collector employing this solar cell module will be described below with reference to FIG. 3.

The box 201 has frames and planes which are formed of iron sheets in order to ensure a strength. Its interior is covered with a heat insulating material of 20 mm thick. Polystylene is used as the heat insulating material. The box has an external size of 910 mm wide, 1,500 mm long and 80 mm high. The interior is narrower for the part corresponding to the heat insulating material, and has a width of 870 mm, a length of 1,460 mm and a depth of 60 mm.

The window 204 is formed of tempered glass and has a thickness of 4 mm so that it has higher load resistance and heat insulating properties and may cause heat loss to the outside as less as possible. It has a size of 890 mm×1,480 mm which substantially forms one side of the heat collector so that the sunshine can be received as much as possible.

The air inlet 202 is positioned on the side in the width direction of the box 201, and is provided in such a way that it can communicate with the space on the non-light-receiving side of the heat collecting plate 206 comprised of the solar cell module. It has a size of 30 mm×300 mm.

The air outlet 203 is positioned on the back of the box 201 and also in the vicinity of the side opposite to the air inlet 202. It is a hole having a size of 150 mm in diameter. This hole communicates with a duct through which the hot air is taken into the house, and hence its size may be selected according to the size of the duct. A dust-proof filter is also provided so that the dust can be prevented from entering into the house.

Inside the box 201, the solar cell module 206 is secured to side walls at L-angles in parallel to the glass window 204, and spacers are partly provided between the solar cell module 206 and the bottom plate so that the former is supported.

The solar cell module is set in the heat collector at a height of 30 mm from the heat insulating material on the bottom thereof. Meanwhile, an air layer of 30 mm thick is formed on the light-receiving side of the solar cell module 206. The air has high heat insulating properties, and this air layer is kept so that it has the function to prevent heat dissipation through the window. An air layer on the non-light-receiving side is 30 mm thick and has an air volume of about 38,000 $cm^2$ which serves as a heating medium.

The electricity generated in the solar cell module 206 is taken outside from the air inlet 202 and air outlet 203 through the cable connectors 208. Since the cable connectors 208 are positioned in the heating medium, they are formed of heat-resistant electric wires covered with silicone resin.

Example 2

Figure 13:
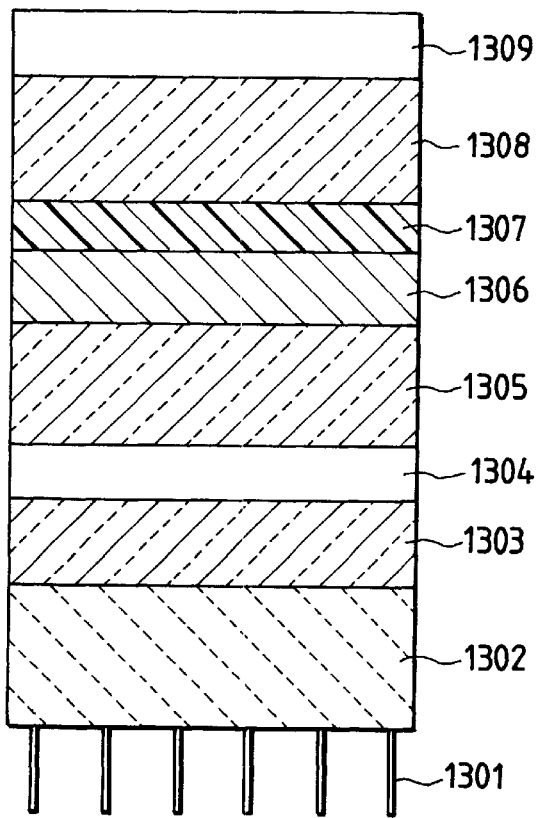
FIG. 13 shows the constitution of Example 2.

In the present Example, a filler was further provided between the back covering film and the back reinforcing member so that the fillers on the top side and back side have the same thickness. The constitution thus obtained is shown in FIG. 13. In the present Example, the back reinforcing member was also provided with fins on the back thereof.

Data on the thermal conduction resistance of the solar cell module are shown in Table 2.

In FIG. 13, reference numeral 1301 denotes the fins for heat dissipation; 1302, the back reinforcing member; 1303, filler 1; 1304, the back covering film; 1305, filler 2; 1306, the solar cell; 1307, the protective film; 1308, filler 3; and 1309, the surface covering film.

With regard to the fins, a sheet of 0.4 mm thick was cut into ten sheets of 20 mm wide and 1,000 mm long each, which were attached to substantially the middle of the non-light-receiving side of the solar cell module at intervals of 5 cm.

Comparative Example 1

The procedure of Example 2 was repeated except that the top-side filler was provided in a thickness of 230 $\mu$m and that the fins were not provided.

Figure 14:
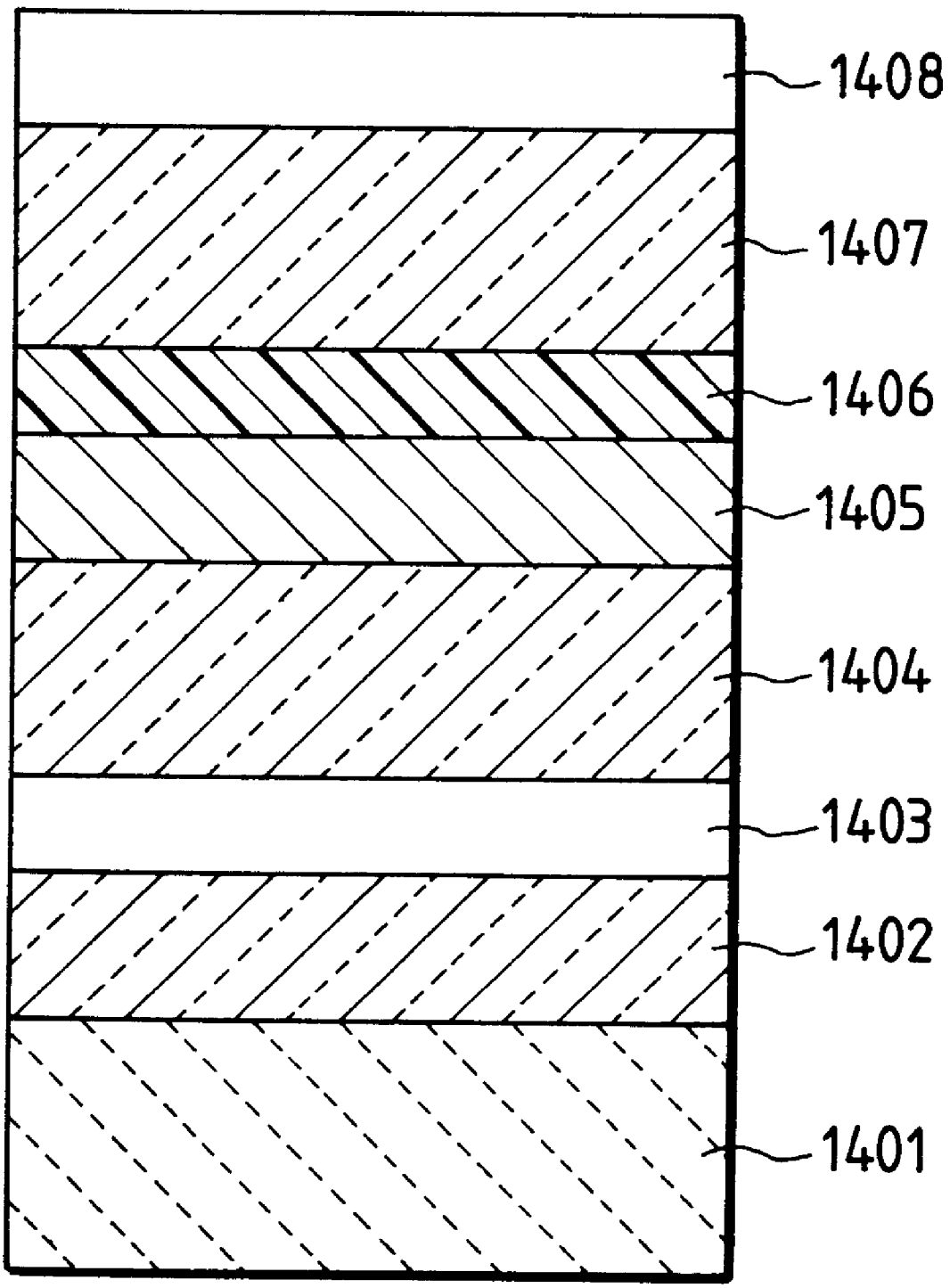
FIG. 14 shows the constitution of Comparative Example 1.

The constitution thus obtained is shown in FIG. 14, and data on its thermal conduction resistance are shown in Table 3. In FIG. 14, reference numeral 1401 denotes the back reinforcing member; 1402, the filler 1; 1403, the back covering film; 1404, the filler 2; 1405, the solar cell; 1406, the protective film; 1407, the filler 3; and 1408, the surface covering film.

Comparative Example 2

The procedure of Example 2 was repeated except that as the heat collecting plate the solar cell module was replaced with a steel sheet. The heat collector obtained has the same constitution as the conventional heat collector.

Comparative Tests

To compare heat collection performance of the heat collectors respectively obtained in Examples 1 and 2 and Comparative Examples 1 and 2, outdoor exposure tests were made. The heat collectors were installed under the same conditions (south-facing; installation angle: 28.6°), and the air temperature was measured at the air outlet.

As air flow rate, the open air of 60° C. was flowed into the heat collector at a rate of 60 m$^2$/hour. The tests were made in Kyoto, Japan, on a fine day in the middle of summer.

The test results are shown in Table 4. The test results show that, when the filler on the light-receiving side has a thickness larger than that on the back side (non-light-receiving side) as in Example 1, the thermal conduction resistance on the light-receiving side can be made higher than that on the non-light-receiving side to bring about an improvement in heat collection effect.

As is also seen therefrom, even when the fillers on the top side and back side have the same thickness as in Example 2, the fins provided on the back of the back reinforcing member contribute to the rise of air temperature.

Example 3

In the present Example, the heat collector constituted as shown in FIGS. 6 and 7 was produced, in which the solar cell module is provided not in the heat collecting plate but to the window member.

The solar cell was fabricated in the same manner as in Example 1.

The window member integrally provided with the solar cell was prepared in the following way. First, white plate glass was made ready for use. It was 4 mm thick and was shaped in a size of 890 mm×2,080 mm. The white glass was used because the window member is positioned at the surface of the heat collector and is required to have properties such as strength and load resistance and to have light transmission properties.

Next, as the filler, EVA (ethylene-vinyl acetate copolymer; weatherable grade) was partly provided at a position of the window member, ranging over 400 mm from an end of the heat collector. The filler was in a thickness of 230 $\mu$m. In the filler, an organic peroxide was contained as a cross-linking agent in an amount of 1.5% by weight.

Next, the solar cell was disposed on the filler within the area of 400 mm from the end in the manner that its light-receiving side faced the window member. Thus, the solar cell was disposed at a position toward one side as shown in FIG. 7.

An additional filler (EVA; thickness: 460 $\mu$m) and, as the back covering film, PET (polyethylene terephthalate) film were laminated. The PET film used here was commonly available one having a heat resistance up to a temperature of 120° C. The one having a thickness of 50 $\mu$m was used.

The integral laminate obtained was pressed and deaerated using a vacuum laminator, during which the filler was caused to melt at 150° C. to effect cross-linking and adhesion between resin layers. Thus, a window with solar cell was produced.

The production of the window with solar cell was thus completed. The heat collector employing this window with solar cell was made up in the same manner as in Example 1 except that the above window with solar cell was used in the window member and a black steel sheet was used as the heat collecting plate 405.

In the present Example, it was possible to maintain the performance of conventional heat collectors and at the same time prevent deterioration of the solar cell performance.

Example 4

In the present Example, the window member used in Example 3 was modified. That is, white glass was used as the window member at the part where the solar cell is present, and blue glass was used at the remaining part. This constitution enables cost reduction without decrease in electricity generation efficiency.

Example 5

In the present Example, the heat collector constituted as shown in FIGS. 8 and 9 was produced, in which the solar cell module is provided not in the heat collecting plate but to the bottom plate.

The solar cell 602 having the protective film 603 was fabricated in the same manner as in Example 1. The bottom plate (FIG. 10) integrally provided with the solar cell was prepared in the following way.

First, zinc-plated steel sheet of 400 μm thick was made ready for use as the back reinforcing member 601. It was cut in a size of 890 mm×2,080 mm. A hole through which positive and negative terminals led from the solar cell are taken out was previously made at a suitable position of the back reinforcing member.

To its surface, EVA as the filler and PET film as the back covering film were laminated.

Next, chloroprene rubber as the heat insulating material 605 was laminated to the surface of the back covering film 607 in a thickness of 20 mm, since it is important not to let the heat away through the bottom of the heat collector, as being important for the bottom plate integral type solar cell that functions as the bottom plate of the air-tight box heat collector.

Subsequently, EVA as the filler 606, the solar cell 602, EVA as the protective film 603, and ETFE (polyethylenetetrafluoroethylene) as the surface covering film 604 were laminated. The surface covering film was previously subjected to plasma treatment on the adherend surface in order to improve its adhesion to the EVA layer.

The integral laminate obtained was pressed and deaerated using a vacuum laminator, during which the filler was caused to melt at 150° C. to effect cross-linking and adhesion between resin layers. Thus, a bottom plate with solar cell was produced.

The production of the bottom plate with solar cell was thus completed. The heat collector employing this bottom plate with solar cell is constituted as shown in FIGS. 8 and 9. The bottom plate with solar cell is disposed inside the box similar to that in Example 1. A heat collecting plate formed of a black iron sheet is secured at L-angles on the side near to the air outlet 502, and spacers (not shown) are disposed between it and the bottom plate. A heat insulating material is provided on the bottom plate and wall surfaces except for the part where the solar cell is provided.

In the present Example, it was possible to maintain the performance of conventional heat collectors and at the same time prevent deterioration of the solar cell performance.

Example 6

Figure 15:
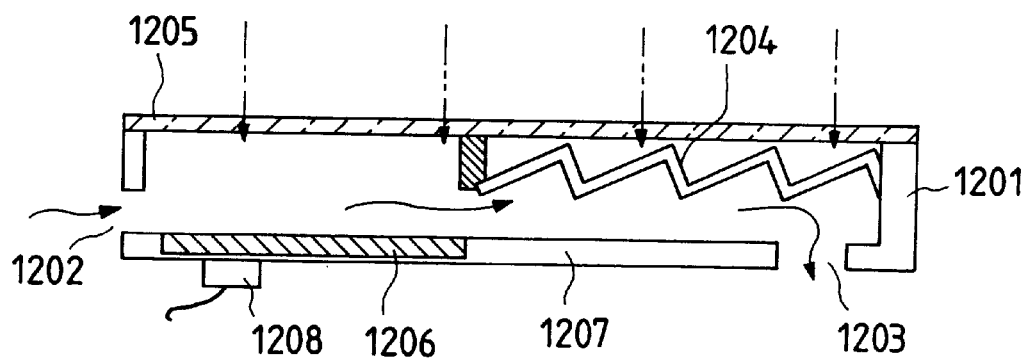
FIG. 15 is a cross-sectional view of the heat collector of Example 6.
Figure 16:
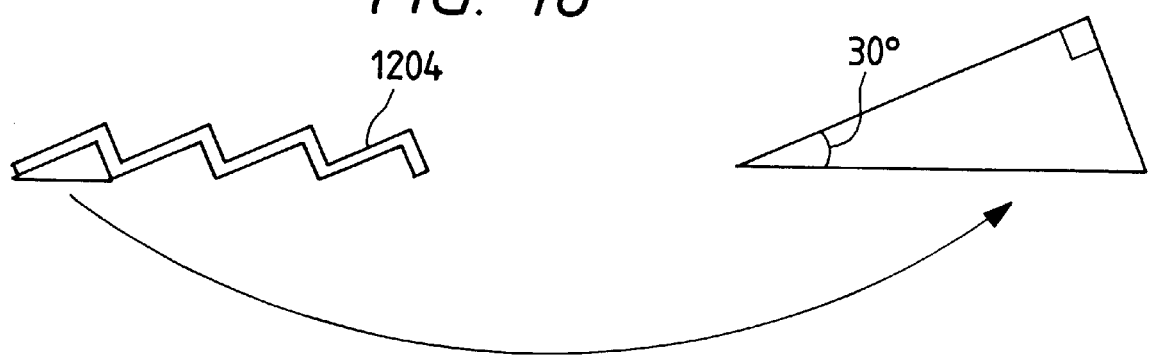
FIG. 16 illustrates angular disposition of the heat collector of Example 6.

The present Example is a modification of Example 5. The heat collecting plate 505 as shown in FIG. 9 was bent to have the shape as shown in FIG. 15. As shown in FIG. 16, it was bent at an inclination of about 30 degrees to thereby improve heat collection efficiency. Also, white plate glass was used as the window member 503 positioned above the solar cell 504 and blue plate glass was used as the window member 503 positioned above the heat collecting plate 505. Except these, the heat collector was constituted in the same manner as in Example 5.

In FIG. 15, reference numeral 1201 denotes the box; 1202, the air inlet; 1203, the air outlet; 1204, the heat collecting plate; 1205, the window plate; 1206, the solar cell; 1207, the bottom plate and 1208, the junction box.

TABLE 1

| Constitution | Material | Thickness ($\times 10^{-3}$) | Thermal conductivity (kcal/mh° C.) | Thermal conduction resistance (m²h° C./cal) |
|---|---|---|---|---|
| Surface covering material: | Glass | 4,000 | 1.10 | 3,636 |
| Top-side filler: | EVA | 0.46 | 0.28 | 1.64 |
| Protective film: | Acrylsilicone | 0.10 | 0.18 | 0.56 |
| | | | | Light-receiving side: 3,638.2 |
| Solar cell: | Heat source (a-Si) | | | |
| Back-side filler: | EVA | 0.23 | 0.28 | 0.82 |
| Back covering film: | PET film | 0.10 | 0.18 | 0.56 |
| | | | | Non-light-receiving side: 1.46 |

TABLE 2

| Constitution | Material | Thickness ($\times 10^{-3}$) | Thermal conductivity (kcal/mh° C.) | Thermal conduction resistance (m²h° C./cal) |
|---|---|---|---|---|
| Surface covering film: | ETFE film | 0.050 | 0.28 | 0.17 |
| Filler 3: | EVA | 0.460 | 0.28 | 1.64 |
| Protective film: | Acrylsilicone | 0.100 | 0.18 | 0.56 |
| | | | | Light-receiving side: 2.38 |
| Solar cell: | Heat source (a-Si) | | | |
| Filler 2: | EVA | 0.230 | 0.28 | 0.82 |

TABLE 2-continued

| Constitution | Material | Thickness ($\times 10^{-3}$) | Thermal conductivity (kcal/mh° C.) | Thermal conduction resistance ($m^2 h$° C./cal) |
|---|---|---|---|---|
| Back covering film: | PET film | 0.050 | 0.18 | 0.28 |
| Filler 1: | EVA | 0.230 | 0.28 | 0.82 |
| Back reinforcing member: | Zinc-coated steel sheet | 0.400 | 38 | 0.01 |
| | | | | Non-light-receiving side: 1.93 |

TABLE 3

| Constitution | Material | Thickness ($\times 10^{-3}$) | Thermal conductivity (kcal/mh° C.) | Thermal conduction resistance ($m^2 h$° C./cal) |
|---|---|---|---|---|
| Surface covering film: | ETFE film | 0.050 | 0.28 | 0.17 |
| Filler 3: | EVA | 0.230 | 0.28 | 0.82 |
| Protective film: | Acrylsilicone | 0.100 | 0.18 | 0.56 |
| | | | | Light-receiving side: 1.56 |
| Solar cell: | Heat source (a-Si) | | | |
| Filler 2: | EVA | 0.230 | 0.28 | 0.82 |
| Back covering film: | PET film | 0.050 | 0.18 | 0.28 |
| Filler 1: | EVA | 0.230 | 0.28 | 0.82 |
| Back reinforcing member: | Zinc-coated steel sheet | 0.400 | 38 | 0.01 |
| | | | | Non-light-receiving side: 1.93 |

TABLE 4

| | Light-receiving side/ non-light-receiving side thermal conduction resistance ratio | Air temperature at air outlet (° C.) |
|---|---|---|
| Example 1 | 2,500 or more | 96 |
| Comp. Ex. 1 | 0.8 | 78 |
| Comp. Ex. 2 | 1.0 | 90 |
| Example 2 | 1.2 | 92 |

What is claimed is:

1. A heat collector comprising a box having on a light-receiving side a window through which sunlight can enter; the box being provided with an inlet through which a fluid heating medium is flowed into the box, an outlet through which the heating medium is flowed out and a heat collecting plate, the collecting plate dividing the inside of the box into a non-light-receiving side and a light-receiving side, and the collecting plate being provided with a solar cell, the solar cell being covered with a surface covering material.

2. The heat collector according to claim 1, wherein the solar cell comprises an amorphous silicon semiconductor.

3. The heat collector according to claim 1, wherein the box has a heat insulating material on its inner wall surfaces.

4. The heat collector according to claim 1, wherein the box is formed of metal, wood, polystyrene, calcium silicate or foamed styrol.

5. The heat collector according to claim 1, wherein the heat collecting plate has a smaller thermal resistance on the non-light-receiving side than on the light-receiving side.

6. The heat collector according to claim 1, wherein the heat collecting plate comprises a reinforcing material, a back covering film, a back-side filler and a top-side filler.

7. The heat collector according to claim 6, wherein the reinforcing material is a metal sheet.

8. The heat collector according to claim 6, wherein the back-side filler has a thickness smaller than the top-side filler.

9. The heat collector according to claim 5, wherein the solar cell is partly provided at a position near to the inlet.

10. The heat collector according to claim 5, wherein the heating medium is flowed on the back of the heat collecting plate.

11. The heat collector according to claim 5, wherein the heat collecting plate has a dark color at least on its non-light-receiving side.

12. The heat collector according to claim 5, wherein the heat collecting plate has a roughed surface, or has a fin, on its non-light-receiving side.

13. A heat collector comprising a box having on a light-receiving side a window through which sunlight can enter; the box being provided with an inlet through which a fluid heating medium is flowed into the box, an outlet through which the heating medium is flowed out and a heat collecting plate; the collecting plate dividing the inside of the box into a non-light-receiving side and a light-receiving side, the window being provided with a solar cell, the solar cell being covered with a back covering material.

14. The heat collector according to claim 13, wherein the window comprises a reinforcing material, a top-side filler and a back-side filler.

15. The heat collector according to claim 14, wherein the reinforcing material comprises glass or a transparent resin plate.

16. The heat collector according to claim 13, wherein the solar cell is partly provided at a position near to the inlet.

17. The heat collector according to claim 13, wherein the heating medium is flowed on the back of the heat collecting plate.

18. The heat collector according to claim 16, wherein the window comprises two windows one of which has the solar cell and the other of which has no solar cell.

19. The heat collector according to claim 18, wherein the window having the solar cell comprises white glass and the window having no solar cell comprises blue glass.

20. A heat collector comprising a box having on a light-receiving side a window through which sunlight can enter; the box being provided with an inlet through which a fluid heating medium is flowed into the box, an outlet through which the heating medium is flowed out and a heat collecting plate; the collecting plate dividing the box into an upper and a lower part at its part where the solar cell is not present, the bottom plate of the box being provided with a solar cell, the solar cell being covered with a surface covering material.

21. The heat collector according to claim 20, wherein the bottom plate comprises a reinforcing material, a back covering material and a filler.

22. The heat collector according to claim 21, wherein the bottom plate further comprises a heat insulating material.

23. The heat collector according to claim 20, wherein the solar cell is partly provided at a position near to the inlet.

24. The heat collector according to claim 20, wherein the heating medium is flowed on the back of the heat collecting plate.

25. The heat collector according to claim 23, wherein the bottom plate comprises two bottom plates one of which has the solar cell and the other of which has no solar cell.

26. The heat collector according to claim 25, wherein the window above the bottom plate having the solar cell comprises white glass and the window above the bottom plate having no solar cell comprises blue glass.

27. The heat collector according to claim 20, wherein the heat collecting plate is bent.

28. A passive solar apparatus comprising:
a heat collector comprising a box having on a light-receiving side a window through which sunlight can enter; the box being provided with an inlet through which a fluid heating medium is flowed into the box, an outlet through which the heating medium is flowed out and a heat collecting plate, the collecting plate dividing the inside of the box into a non-light-receiving side and a light-receiving side, and the collecting plate being provided with a solar cell, the solar cell being covered with a surface covering material;
a duct communicating with the outlet to introduce the heating medium into a house; and
a fan provided in the course of the duct.

29. The passive solar apparatus according to claim 28, wherein the solar cell comprises an amorphous silicon semiconductor.

30. The passive solar apparatus according to claim 28, wherein the box has a heat insulating material on its inner wall surfaces.

31. The passive solar apparatus according to claim 28, wherein the box is formed of metal, wood, polystyrene, calcium silicate or foamed styrol.

32. The passive solar apparatus according to claim 31, wherein the heat collecting plate has a smaller thermal resistance on the non-light-receiving side than on the light-receiving side.

33. The passive solar apparatus according to claim 28, wherein the heat collecting plate comprises a reinforcing material, a back covering film, a back-side filler and a top-side filler.

34. The passive solar apparatus according to claim 33, wherein the reinforcing material is a metal sheet.

35. The passive solar apparatus according to claim 33, wherein the back-side filler has a thickness smaller than the top-side filler.

36. The passive solar apparatus according to claim 35, wherein the solar cell is partly provided at a position near to the inlet.

37. The passive solar apparatus according to claim 35, wherein the heating medium is flowed on the back of the heat collecting plate.

38. The passive solar apparatus according to claim 35, wherein the heat collecting plate has a dark color at least on its non-light-receiving side.

39. The passive solar apparatus according to claim 35, wherein the heat collecting plate has a roughed surface, or has a fin, on its non-light-receiving side.

40. A passive solar apparatus comprising:
a heat collector comprising a box having on a light-receiving side a window through which sunlight can enter; the box being provided with an inlet through which a fluid heating medium is flowed into the box, an outlet through which the heating medium is flowed out and a heat collecting plate; the collecting plate dividing the inside of the box into a non-light-receiving side and a light-receiving side, the window being provided with a solar cell, the solar cell being covered with a back covering material;
a duct communicating with the outlet to introduce the heating medium into a house; and
a fan provided in the course of the duct.

41. The passive solar apparatus according to claim 40, wherein the window comprises a reinforcing material, a top-side filler and a back-side filler.

42. The passive solar apparatus according to claim 41, wherein the reinforcing material comprises glass or a transparent resin plate.

43. The passive solar apparatus according to claim 40, wherein the solar cell is partly provided at a position near to the inlet.

44. The passive solar apparatus according to claim 40, wherein the heating medium is flowed on the back of the heat collecting plate.

45. The passive solar apparatus according to claim 43, wherein the window comprises two windows one of which has the solar cell and the other of which has no solar cell.

46. The passive solar apparatus according to claim 45, wherein the window having the solar cell comprises white glass and the window having no solar cell comprises blue glass.

47. A passive solar apparatus comprising:
a heat collector comprising a box having on a light-receiving side a window through which sunlight can enter; the box being provided with an inlet through which a fluid heating medium is flowed into the box, an outlet through which the heating medium is flowed out and a heat collecting plate; the colleting plate dividing the box into an upper and a lower part at its part where the solar cell is not present, the bottom plate of the box being provided with a solar cell, the solar cell being covered with a surface covering material;
a duct communicating with the outlet to introduce the heating medium into a house; and
a fan provided in the course of the duct.

48. The passive solar apparatus according to claim 47, wherein the bottom plate comprises a reinforcing material, a back covering material and a filler.

49. The passive solar apparatus according to claim 48, wherein the bottom plate further comprises a heat insulating material.

50. The passive solar apparatus according to claim 47, wherein the solar cell is partly provided at a position near to the inlet.

51. The passive solar apparatus according to claim 47, wherein the heating medium is flowed on the back of the heat collecting plate.

52. The passive solar apparatus according to claim 50, wherein the bottom plate comprises two bottom plates one of which has the solar cell and the other of which has no solar cell module.

53. The passive solar apparatus according to claim 52, wherein the window above the bottom plate having the solar cell comprises white glass and the window above the bottom plate having no solar cell comprises blue glass.

54. The passive solar apparatus according to claim 47, wherein the heat collecting plate is bent.

55. The heat collector according to claim 13, wherein the solar cell comprises an amorphous silicon semiconductor.

56. The heat collector according to claim 13, wherein the box has a heat insulating material on its inner wall surfaces.

57. The heat collector according to claim 13, wherein the box is formed of metal, wood, polystyrene, calcium silicate or foamed styrol.

58. The heat collector according to claim 20, wherein the solar cell comprises an amorphous silicon semiconductor.

59. The heat collector according to claim 20, wherein the box has a heat insulating material on its inner wall surfaces.

60. The heat collector according to claim 20, wherein the box is formed of metal, wood, polystyrene, calcium silicate or foamed styrol.

61. The passive solar apparatus according to claim 40, wherein the solar cell comprises an amorphous silicon semiconductor.

62. The passive solar apparatus according to claim 40, wherein the box has a heat insulating material on its inner wall surfaces.

63. The passive solar apparatus according to claim 40, wherein the box is formed of metal, wood, polystyrene, calcium silicate or foamed styrol.

64. The passive solar apparatus according to claim 47, wherein the solar cell comprises an amorphous silicon semiconductor.

65. The passive solar apparatus according to claim 47, wherein the box has a heat insulating material on its inner wall surfaces.

66. The passive solar apparatus according to claim 47, wherein the box is formed of metal, wood, polystyrene, calcium silicate or foamed styrol.

* * * * *

UNITED STATES PATENT AND TRADEMARK OFFICE
CERTIFICATE OF CORRECTION

PATENT NO.    : 6,018,123
DATED         : January 25, 2000
INVENTOR(S)   : Takeshi Takada, et al.

It is certified that error appears in the above-identified patent and that said Letters Patent is hereby corrected as shown below:

Title page,
Item [56] References Cited, under FOREIGN PATENT DOCUMENTS:

"4343481" should read -- 4-343481 --; and
"7280358" should read -- 7-280358 --.

Column 1,
Line 30, "from an inlet 116 it" should read -- it from an inlet 116 --; and
Line 38, "an" should read -- a --.

Column 3,
Line 23, "the both" should read -- both --;
Line 27, "upper and lower two parts." should read -- two parts, an upper and a lower. --;
Line 36, "well" should read -- too --; and
Line 55, "mount" should read -- amount --.

Column 4,
Line 58, "form" should read -- form of --.

Column 6,
Line 16, "a-Sic." should read -- a-SiC. --.

Column 8,
Line 31, "less" should read -- little --.

Column 14,
Line 36, "claim 5" should read -- claim 1 --;.
Line 38, "claim 5" should read -- claim 1 --;
Line 40, "claim 5" should read -- claim 1 --; and
Line 43, "claim 5" should read -- claim 1 --;

UNITED STATES PATENT AND TRADEMARK OFFICE
CERTIFICATE OF CORRECTION

| | |
|---|---|
| PATENT NO. | : 6,018,123 |
| DATED | : January 25, 2000 |
| INVENTOR(S) | : Takeshi Takada, et al. |

It is certified that error appears in the above-identified patent and that said Letters Patent is hereby corrected as shown below:

<u>Column 16,</u>
Line 1, "claim 35" should read -- claim 31 --;
Line 4, "claim 35" should read -- claim 31 --;
Line 6, "claim 35" should read -- claim 31 --;
Line 9, "claim 35" should read -- claim 31 --.

Signed and Sealed this

Twenty-third Day of October, 2001

Attest:

*Nicholas P. Godici*

NICHOLAS P. GODICI
*Attesting Officer*   *Acting Director of the United States Patent and Trademark Office*